(12) United States Patent
Saita et al.

(10) Patent No.: US 7,453,153 B2
(45) Date of Patent: Nov. 18, 2008

(54) CIRCUIT DEVICE

(75) Inventors: Atsushi Saita, Kobe (JP); Toshikazu Imaoka, Ogaki (JP); Tetsuro Sawai, Hashima (JP); Yasunori Inoue, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 227 days.

(21) Appl. No.: 11/391,680

(22) Filed: Mar. 29, 2006

(65) Prior Publication Data

US 2006/0238961 A1 Oct. 26, 2006

(30) Foreign Application Priority Data

Mar. 29, 2005 (JP) ............................. 2005-095918
Mar. 17, 2006 (JP) ............................. 2006-075340

(51) Int. Cl.
*H01L 23/552* (2006.01)
*H01L 23/34* (2006.01)

(52) U.S. Cl. ................. 257/777; 257/660; 257/686; 257/706; 257/E23.114; 257/E25.013; 438/108; 438/109

(58) Field of Classification Search ........... 257/660, 257/686, 777
See application file for complete search history.

(56) References Cited

U.S. PATENT DOCUMENTS 6,737,750 B1 * 5/2004 Hoffman et al. ............ 257/777
7,205,651 B2 * 4/2007 Do et al. .................... 257/706
7,245,003 B2 * 7/2007 Li ............................. 257/660
2003/0020151 A1   1/2003 Chen et al.

FOREIGN PATENT DOCUMENTS

| JP | 09-186289 | 7/1997 |
|----|-----------|--------|
| JP | 11-204720 A | 7/1999 |
| JP | 2004-111656 A | 4/2004 |

OTHER PUBLICATIONS

Chinese Office Action, with English Translation, issued in Chinese Patent Application No. CN 200610089893.7, dated Mar. 7, 2008.
Japanese Office Action, with English Translation, issued in Japanese Patent Application No. JP 2006-075340, dated Apr. 22, 2008.

* cited by examiner

*Primary Examiner*—Dao H Nguyen
(74) *Attorney, Agent, or Firm*—McDermott Will & Emery LLP

(57) ABSTRACT

The ground noise is reduced which propagates between circuit elements in a circuit device having a multiple stack structure. A grounding bonding pad provided on the surface of a second circuit element is connected to a bonding wire provided on the surface of a conduction layer via a grounding wire such as gold. A bonding pad provided on the surface of the conductive layer is connected to a lead provided on a ground wire via a grounding wire such as gold. This structure creates a capacitance between the second circuit element and the conduction layer so as to prevent the propagation of noise circuit from element to the ground wiring.

11 Claims, 14 Drawing Sheets

CIRCUIT DEVICE

BACKGROUND OF THE INVENTION

1. Field of the Invention

The present invention relates to circuit devices having a plurality of circuit elements mounted therein, and it particularly relates to a circuit device in which a plurality of circuit elements are multilayered.

2. Description of the Related Art

Portable electronics devices, such as mobile phones, PDAs, DVCs and DSCs, are today gaining higher functions at an accelerated pace. For them to be accepted by the market, however, such products must be small and lightweight. To achieve that, system LSIs of high integration are much in demand. On the other hand, what is required of these electronics devices is handiness and ease of use, and consequently the demand is high for the high function and high performance of LSIs used in these devices. As a result, while the number of I/Os increases along with the higher integration of LSI chips, there is an increasing demand for smaller packages. To reconcile these mutually conflicting demands, it is strongly desired that semiconductor packages be developed that are suited to the high-density board mounting of semiconductor parts.

A known packaging technology to meet these demands for higher density is a multiple stack structure for the multilayering of circuit elements. Such circuit elements are to be noted to include elements such as semiconductor chips. Reference (1) in the following Related Art List discloses a circuit device with bottom-layer semiconductor chips wire-bonded to the substrate.

Reference (2) in the following Related Art List discloses a circuit arrangement with the bottom-layer semiconductor chip flip-chip-bonded to the substrate.

FIG. 13 is a cross-sectional view showing a structure of a circuit device disclosed in Reference (1). The lower-layer semiconductor chip 3 and the upper-layer semiconductor chip 4 are stacked in a vertical direction, and a heat-transfer conductive layer 5 is interposed between the lower-layer semiconductor chip 3 and the upper-layer semiconductor chip 4. The lower-layer semiconductor chip 3 and the upper-layer semiconductor chip 4 are connected to the wiring layer of the substrate 2 by means of bonding wire 7 and bonding wire 8, respectively. The heat-transfer conductive layer 5 is connected to the ground wiring of the substrate 2.

FIG. 14 is an equivalent circuit diagram showing the states of potentials during the operation of the circuit elements as disclosed in Reference (1). The voltage drop due to a resistance component occurring in the bonding wire 7 for grounding is the potential difference V1' between the ground potential of the lower-layer semiconductor chip 3 and the ground potential of the substrate 2. The voltage drop due to the resistance component and inductance component occurring in the bonding wire 7 for power supply is the potential difference V2' between the power supply potential of the lower-layer semiconductor chip 3 and the power supply potential of the substrate 2. The voltage drop caused by a circuit provided on the lower-layer semiconductor chip 3 is denoted by V3'. It is to be noted that the inductance components of L1', L2', L4' and L5' shown in FIG. 14 are the causes of noise amplification.

On the other hand, the voltage drop due to a resistance component occurring in the bonding wire 8 for grounding is the potential difference V4' between the ground potential of the upper-layer semiconductor chip 4 and the ground potential of the substrate 2. The voltage drop due to the resistance component occurring in the bonding wire 8 for power supply is the potential difference V5' between the power supply potential of the upper-layer semiconductor chip 4 and the power supply potential of the substrate 2. The voltage drop caused by a circuit provided on the upper-layer semiconductor chip 4 is denoted by V6'.

Related Art List
(1) Japanese Patent Application Laid-Open No. 2004-111656.
(2) Japanese Patent Application Laid-Open No. Hei11-204720.

In a conventional circuit arrangement as represented in Reference (1), there are cases where noise having a high-frequency component occurring at the ground potential of the upper-layer semiconductor chip is propagated to the ground wiring of the substrate as indicated by arrow A in FIG. 14. This noise component affecting the lower-layer semiconductor chip via the ground wiring has been a factor of destabilizing the operation of the circuit device, thus causing a drop in reliability. Hereinbelow, the noise propagating through the ground wiring is referred to as ground noise.

SUMMARY OF THE INVENTION

The present invention has been made in view of the foregoing circumstances and a general purpose thereof is to provide a circuit device having a multiple stack structure featuring reduced ground noise propagating between circuit elements thereof.

One embodiment of the present invention relates to a circuit device, and the circuit device comprises: a substrate provided with ground wiring a plurality of circuit elements laminated on the substrate; a pair of insulation layers provided between at least one set of an upper-layer circuit element and a lower-layer circuit element disposed adjacent to each other, among the plurality of circuit elements; and a conductive layer interposed between the pair of insulation layers, wherein the upper-layer circuit element connects to the ground wiring by way of the conductive layer.

By employing this structure, a capacitance component occurring between the upper-layer circuit element and the conductive layer becomes a capacitor, which in turn functions as a noise filter. Hence, the propagation of the noise component occurring in the upper-layer circuit element to the other circuit elements via the ground wiring can be suppressed. Similarly, since a capacitance component occurring between the lower-layer circuit element and the conductive layer becomes a capacitor and functions as a noise filter, the propagation of the noise component occurring in the upper-layer circuit element to the other circuit element via the ground wiring can be suppressed. As a result, the operation of each circuit element is stabilized and the reliability of a circuit device having the multiple stack structure is improved.

In the above structure, the bottom-layer circuit element in the plurality of circuit elements may be flip-chip bonded to the substrate.

The flip-chip bonding implementation can make the inductance component smaller as compared with the wire bonding implementation. Hence, the noise amplification of the bottom-layer circuit element 30 can be restricted.

When the bottom-layer circuit element is wire-bonded to the substrate, there occur direct paths between the wires of the bottom-layer circuit element and the wires of an upper-layer circuit element by way of a lead of a ground wiring. In contrast, when the bottom-layer circuit element is flip-chip bonded, there occur no direct paths such as occur in the wire bonding implementation, so that the propagation of ground noise from the bottom-layer circuit element to the upper-layer circuit element can be restricted.

Moreover, the effect of digital noise, such as electromagnetic interference (EMI), occurring in the bottom-layer circuit element on the upper-layer circuit element is avoided.

Another embodiment of the present invention relates also to a circuit device, and this circuit device comprises: a ground wiring; a plurality of circuit elements laminated on the ground wiring; a pair of insulation layers provided between at least one set of an upper-layer circuit element and a lower-layer circuit element disposed adjacent to each other, among the plurality of laminated circuit elements; and a conductive layer interposed between the pair of insulation layers, wherein the upper-layer circuit element connects to the ground wiring by way of the conductive layer.

A circuit device according to any of the above embodiments has two circuit elements laminated therein, and the top circuit element may connect to the ground wiring by way of the conductive layer provided between the top circuit element and the bottom circuit element.

According to this embodiment, the reliability of a circuit device having two-stack structure is improved.

A circuit device according to any of the above embodiments has three or more circuit elements laminated therein, and each circuit element disposed second from the bottom and upper than second therefrom may connect to the ground wiring by way of a conductive layer provided between the each circuit element and each circuit element disposed therebelow.

According to this embodiment, the effect of the ground noise occurring in the circuit elements second from the bottom and upward therefrom on the other circuit elements is suppressed. Hence, the reliability of a circuit device having three or more stack structure is improved.

In a circuit device according to any of the above embodiments, a portion of the conductive layer overlapped with the insulation layer placed above the conductive layer, which is used for grounding of a circuit element, may be equal to a projected portion of the circuit element facing the insulation layer placed above the conductive layer.

According to this embodiment, the generated capacitance of the capacitor can be made larger, so that the characteristic as a noise filter is improved.

In a circuit device according to any of the above embodiments, the area of the conductive layer used for grounding of a circuit element may be larger than that of an insulation layer above the conductive layer.

According to this embodiment, part of the top surface of the conductive layer is exposed. As a result, a circuit element to be grounded can be easily bonded to the exposed portion, thus making the fabrication of the circuit device easier.

It is to be noted that any arbitrary combinations or rearrangement, as appropriate, of the aforementioned constituting elements and so forth are all effective as and encompassed by the embodiments of the present invention and the scope of the invention protected by this patent application.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

First Embodiment

Figure 1:
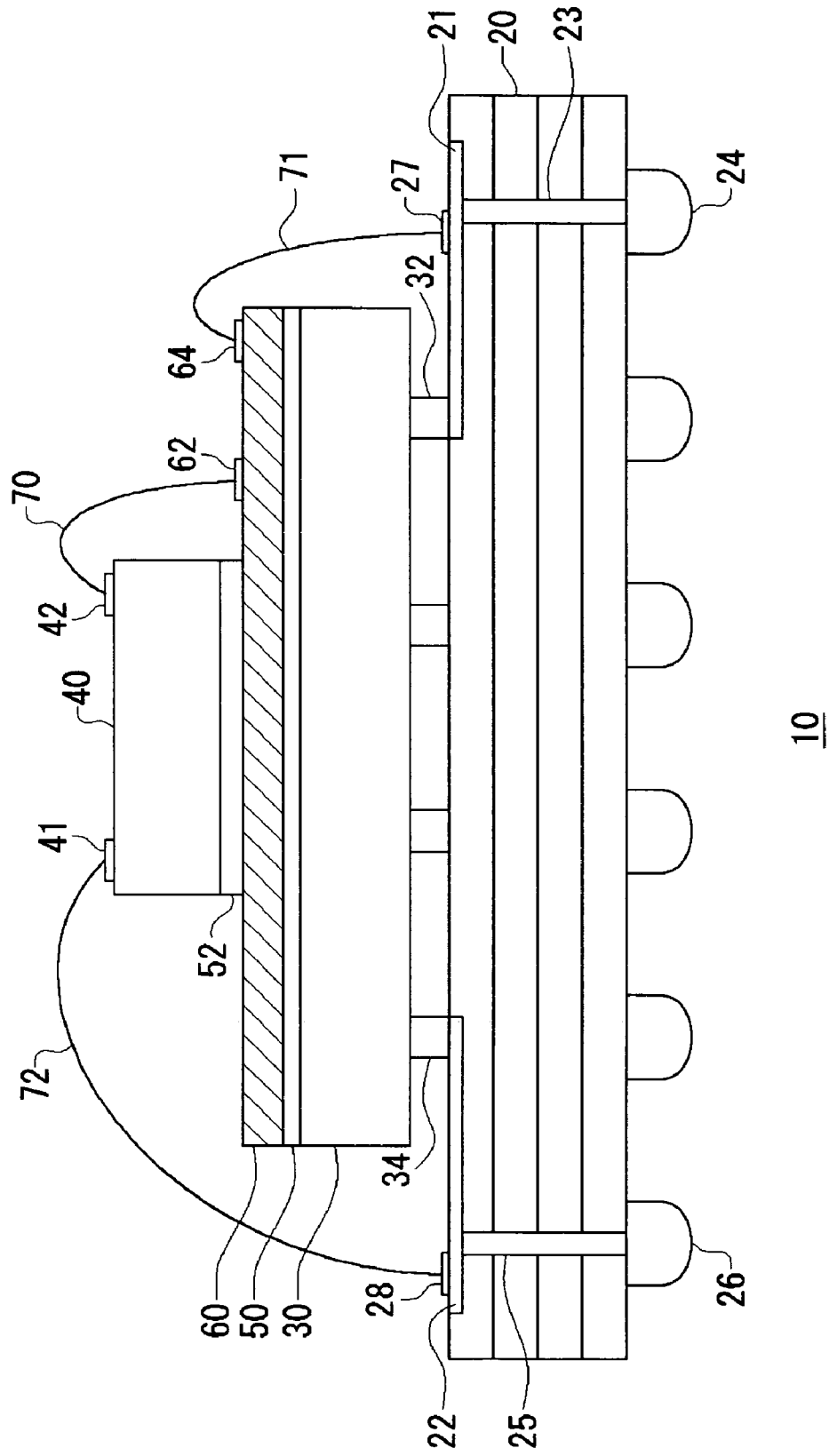
FIG. 1 is a cross-sectional view showing a structure of a circuit device according to a first embodiment of the present invention.
Figure 2:
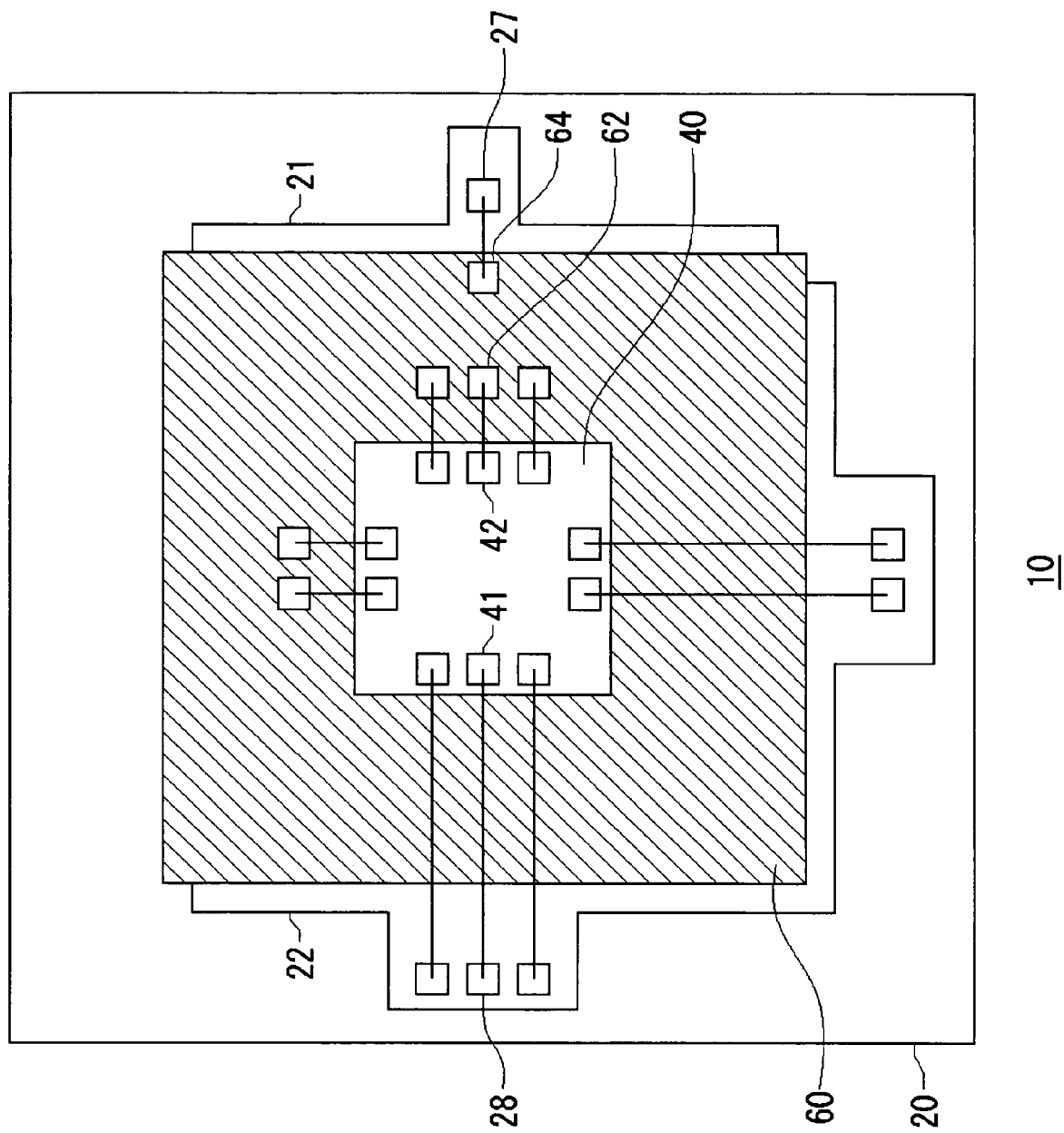
FIG. 2 is a plan view showing a circuit device according to the first embodiment.

FIG. 1 is a cross-sectional view showing a structure of a circuit device according to a first embodiment of the present invention. FIG. 2 is a plan view showing a circuit device according to the first embodiment.

A circuit device 10 according to the first embodiment includes a substrate 20, a first circuit element 30, which is flip-chip-bonded to the substrate 20, a second circuit element 40, which is stacked on top of the first circuit element 30, a pair of insulation layers, namely, an insulation layer 50 and an insulation layer 52, which are interposed between the first circuit element 30 and the second circuit element 40, and a conductive layer 60, which is interposed between the insulation layer 50 and the insulation layer 52.

The substrate 20 has a multilayer wiring structure of a plurality of stacked wiring layers. Provided on the surface of the substrate 20 are a ground wiring 21 and a power supply wiring 22. The ground wiring 21 is connected to a BGA ball 24 via a copper wiring filled in a via hole 23. The power supply wiring 22 is connected to a BGA ball 26 via a copper wiring filled in a via hole 25.

The grounding electrode of the first circuit element 30 is connected to the ground wiring 21 via a bump 32. The power supply electrode of the first circuit element 30 is connected to the power supply wiring 22 via a bump 34.

A bonding pad 41 for power supply provided on the surface of the second circuit element 40 is connected to a lead 28 provided on the power supply wiring 22 via a power supply wire 72 made of gold or the like.

A bonding pad 42 for grounding provided on the surface of the second circuit element 40 is connected to a bonding pad 62 provided on the surface of the conductive layer 60 via a grounding wire 70 made of gold or the like. Further, a bonding pad 64 provided on the surface of the conductive layer 60 is connected to a lead 27 provided on the ground wiring 21 via a grounding wire 71 made of gold or the like. In this manner, a circuit device 10 according to the first embodiment has a second circuit element 40 connected to a ground wiring 21 via a conductive layer 60.

Figure 3:
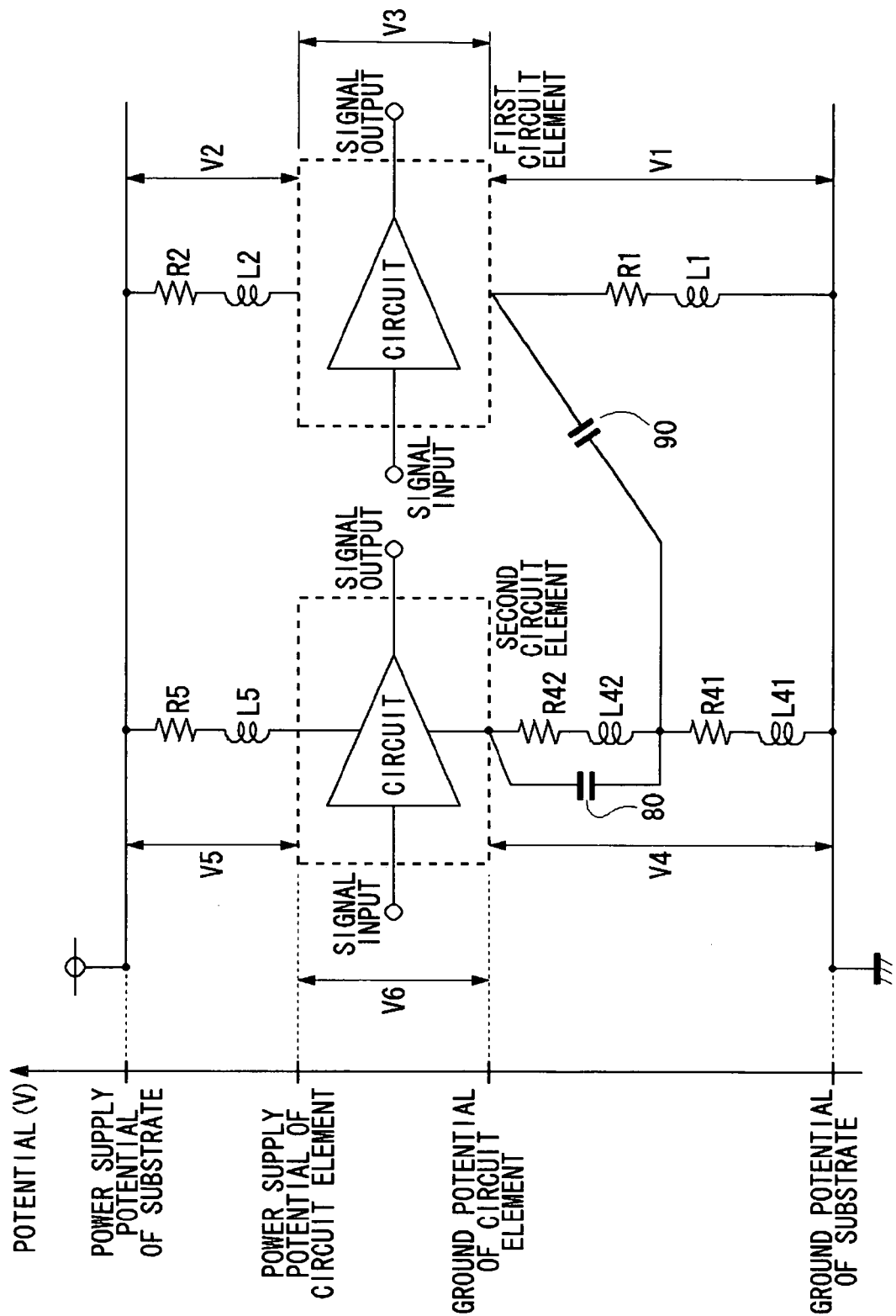
FIG. 3 is an equivalent circuit diagram showing the states of potentials during an operation of a circuit device according to the first embodiment.

FIG. 3 is an equivalent circuit diagram showing the states of potentials during an operation of a circuit device according to the first embodiment. With respect to a first circuit element 30, the voltage drop due to a resistance component occurring in a grounding bump 32 used in flip chip bonding is the potential difference V1 between the ground potential of the first circuit element 30 and the ground potential of a substrate 20. The voltage drop due to a resistance component occurring in a power supply bump 34 used in flip chip bonding is the potential difference V2 between the power supply potential of the substrate 20 and the power supply potential of the first circuit element 30. It is to be noted that the voltage drop caused by a circuit provided on the first circuit element 30 is denoted by V3.

On the other hand, with respect to a second circuit element 40, the sum of voltage drops due to resistance components occurring in a grounding wire 70 and a grounding wire 71, respectively, is the potential difference V4 between the ground potential of the second circuit element 40 and the ground potential of the substrate 20. Also, the voltage drop due to a resistance component occurring in a power supply wire 72 is the potential difference V5 between the power supply potential of the substrate 20 and the power supply potential of the second circuit element 40. The voltage drop caused by a circuit provided on the second circuit element 40 is denoted by V6.

When a circuit device 10 according to the first embodiment operates, a capacitance component occurs between the second circuit element 40 and the conductive layer 60, and thus the second circuit element 40, the insulation layer 52 and the conductive layer 60 together function as a capacitor. That is, this can be regarded as a capacitor 80 connected in parallel with a grounding wire 70 as shown in FIG. 3. And this capacitor 80 functioning as a noise filter reduces the propagation of the ground noise occurring in the second circuit element 40 to the ground wiring 21 of the substrate 20. As a result, the ground noise occurring in the second circuit element 40 has reduced effects on the first circuit element 30. Similarly, a capacitance component occurs between the first circuit element 30 and the conductive layer 60, so that the first circuit 30, the insulation layer 52 and the conductive layer 60 together function as a capacitor. That is, this can be regarded as a capacitor 90 connected in parallel with a grounding wire 71 and a grounding bump 32 as shown in FIG. 3. And this capacitor 90 functioning also as a noise filter reduces the circuit element 40 to the ground wiring 21 of the substrate 20. As a result, the effect of the ground noise, having occurred in the second circuit element 40, on the first circuit element 30 can be reduced.

Figure 14:
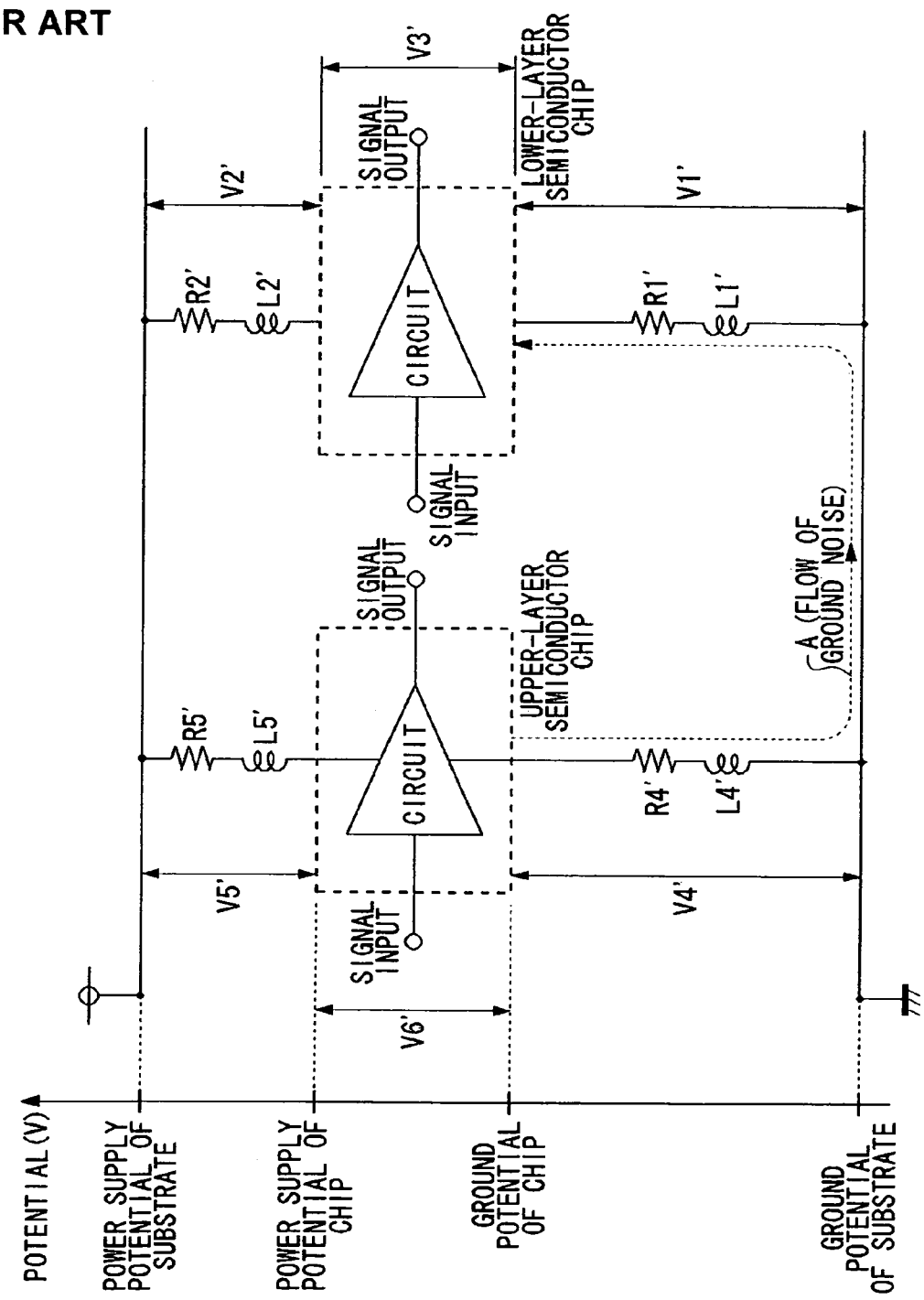
FIG. 14 is an equivalent circuit diagram showing the states of potentials during an operation of circuit device.

Also, the flip chip bonding of the first circuit element 30 results in a smaller inductance value of L1 in FIG. 3 than that of L1' of a conventional circuit arrangement shown in FIG. 14, so that the noise amplification of the first circuit element 30 can be restricted.

Also, when a bottom-layer circuit element is wire-bonded to the substrate, there occur direct paths between the wires of the bottom-layer circuit element and the wires of an upper-layer circuit element by way of the lead of the ground wiring. In contrast thereto, when a bottom-layer circuit element is flip-chip bonded, there occur no direct paths such as occur in the wire bonding implementation, so that the propagation of ground noise from the bottom-layer circuit element to an upper-layer circuit element can be restricted.

Moreover, an arrangement to have both the bottom-layer circuit element and the upper-layer circuit element face outward avoids the effects of digital noise, such as electromagnetic interference (EMI), occurring in the bottom-layer circuit element on the upper-layer circuit element.

It is desirable that a portion of the conductive layer 60 overlapped with the insulation layer above the conductive layer 60, which is used for the grounding of the second circuit element 40, be nearly equal to the projected portion of the second circuit element 40 facing the insulation layer 52. Here, it is not necessary that the above-mentioned overlapped portion is exactly equal to the projected portion of the second circuit element 40, but suffices if the overlapped portion is 80% or more of the projected portion of the second circuit element 40.

This arrangement results in a large capacitance of the capacitor, thus improving the characteristic as a noise filter.

It is also desirable that the area of the conductive layer 60 used for the grounding of the second circuit element 40 be larger than that of the insulation layer 52 above the conductive layer 60.

Such an arrangement produces an exposed portion of the top surface of the conductive layer 60, to which a circuit element to be grounded can be easily bonded, thus making the fabrication of the circuit device easier. Since a wire bonding normally requires a width of 60 to 70 μm, it is desirable that each side of the conductive layer 60 be about 200 μm longer than the insulation layer 52.

Method for Stacking Circuit Elements

Hereinbelow, a description will be given of a method for stacking circuit elements on a substrate 20.

Figure 4A:
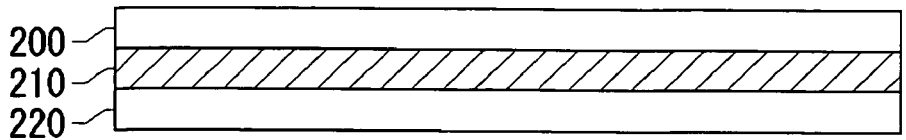
FIGS. 4A to 4D are cross-sectional views showing a process of laminating a circuit elements on a substrate.

A laminated structure of an insulating resin sheet 200, a conductive sheet 210 and a UV sheet 220 stacked from top to bottom as illustrated in FIG. 4A is to be prepared.

Suggested as the resin sheet 200 is a die-attach sheet of epoxy resin with adhesive applied to its surface to be bonded with the first circuit element 30, for instance. The thickness of the resin sheet 200 is typically 60 μm.

Usable as the conductive sheet 210 is a copper foil provided with an Au/Ni layer for bonding gold wire to the surface coming in contact with the UV sheet 220. The Au/Ni layer may be formed, for instance, by an electroless Ni—Au plating. The thickness of the conductive sheet 210 is typically 12 μm. Note that the material for the conductive sheet 210 is not limited to copper foil, but may be replaced by a conductive material such as a conductive paste.

The UV sheet 220 is, for instance, a resin sheet that can be peeled easily by ultraviolet irradiation, which lowers the adhesiveness.

Figure 4B:
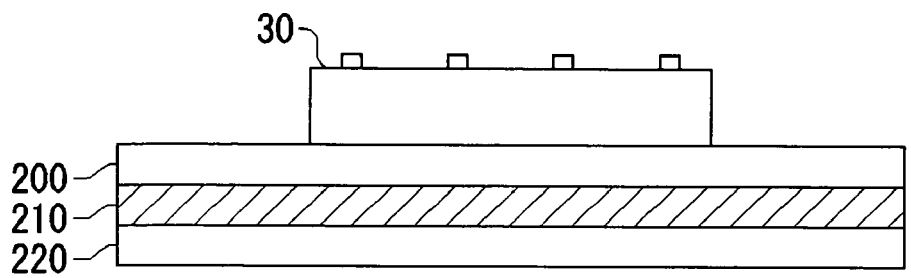

Next, as shown in FIG. 4B, a first circuit element 30 is attached to the resin sheet 200, with the surface of the first circuit element 30 up where flip-chip bonding implementation is to be done.

Figure 4C:
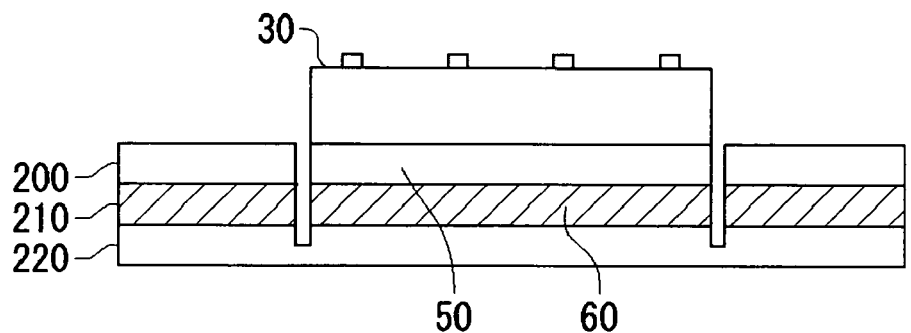

Then, as shown in FIG. 4C, the resin sheet 200 and the conductive sheet 210 are cut by dicing into the same size as the first circuit element 30. At this time, half-etching is done to the UV sheet 220.

Of the resin sheet 200, the portion thereof cut into the same size as the first circuit element 30 becomes an insulation layer 50. Of the conductive sheet 210, the portion thereof cut into the same size as the first circuit element 30 becomes a conductive layer 60.

Figure 4D:
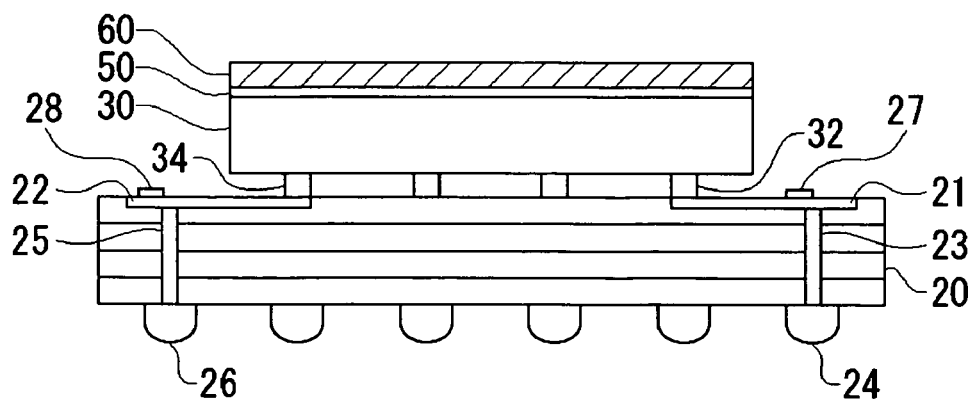

Next, as shown in FIG. 4D, the first circuit element 30 is flip-chip-bonded to a substrate 20, and then the UV sheet 220 is removed by peeling it off by an irradiation of ultraviolet rays. In the flip chip bonding, the bump 32 for grounding is connected to the ground wiring 21, and the bump 34 for power supply is connected to the power supply wiring 22.

On the other hand, a processing as described below is carried out for a second circuit element 40, which is to be stacked on the first circuit element 30.

Figure 5A:
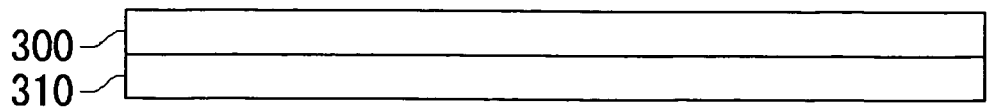
FIGS. 5A to 5D are cross-sectional views showing a process of laminating a circuit elements on a substrate.

Firstly, as shown in FIG. 5A, a laminated structure of a resin sheet 300 and a UV sheet 310 is prepared.

Suggested as the resin sheet 300 is a die-attach sheet of epoxy resin with adhesive applied to its surface to be stuck to the second circuit element 40, for instance. The thickness of the resin sheet 300 is typically 60 μm. Note that the thinner the thickness of the resin sheet 300 is, the better and that the higher the dielectric constant thereof is, the better. This arrangement results in a larger capacitance of the capacitor functioning as a noise filter during the operation of the circuit elements, so that noise can be removed more effectively.

Figure 5B:
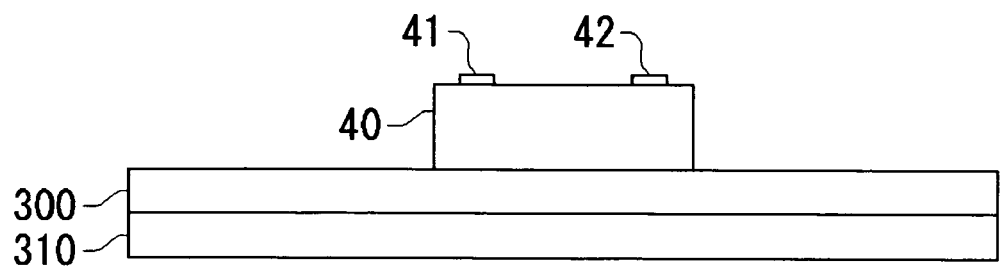

Next, as shown in FIG. 5B, the resin sheet 300 is attached to the back surface of the second circuit element 40.

Figure 5C:
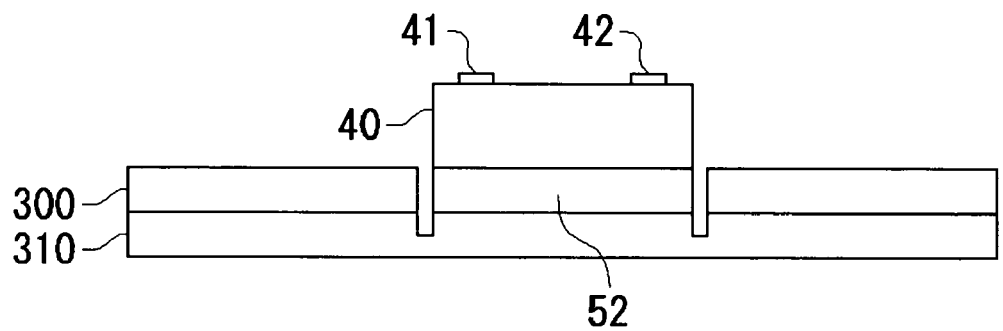

Then, as shown in FIG. 5C, the resin sheet 300 is cut by dicing into the same size as the second circuit element 40. At this time, half-etching is done to the UV sheet 310.

Of the resin sheet 300, the portion thereof cut into the same size as the second circuit element 40 becomes an insulation layer 52.

Figure 5D:
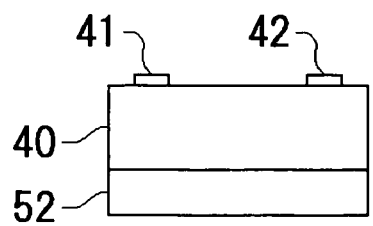

Then, as shown in FIG. 5D, the UV sheet 310 is removed by peeling it off by an irradiation of ultraviolet rays.

Now the first circuit element 30 and the second circuit element 40 having been prepared as described above are stacked by pasting the conductive layer 60 on the side of the first circuit element 30 to the insulation layer 52 on the side of the second circuit element 40. Following this, a bonding pad 41 for power supply and a bonding pad 42 for grounding are formed on the exposed part of the conductive layer 60 and then the bonding pad 41 and the bonding pad 42 are wire-bonded to lead 28 and lead 27, respectively, thus forming a circuit arrangement as shown in FIG. 1. Note that gold wire whose diameter is 25 μm is recommended as wire for wire-bonding.

Second Embodiment

Figure 6:
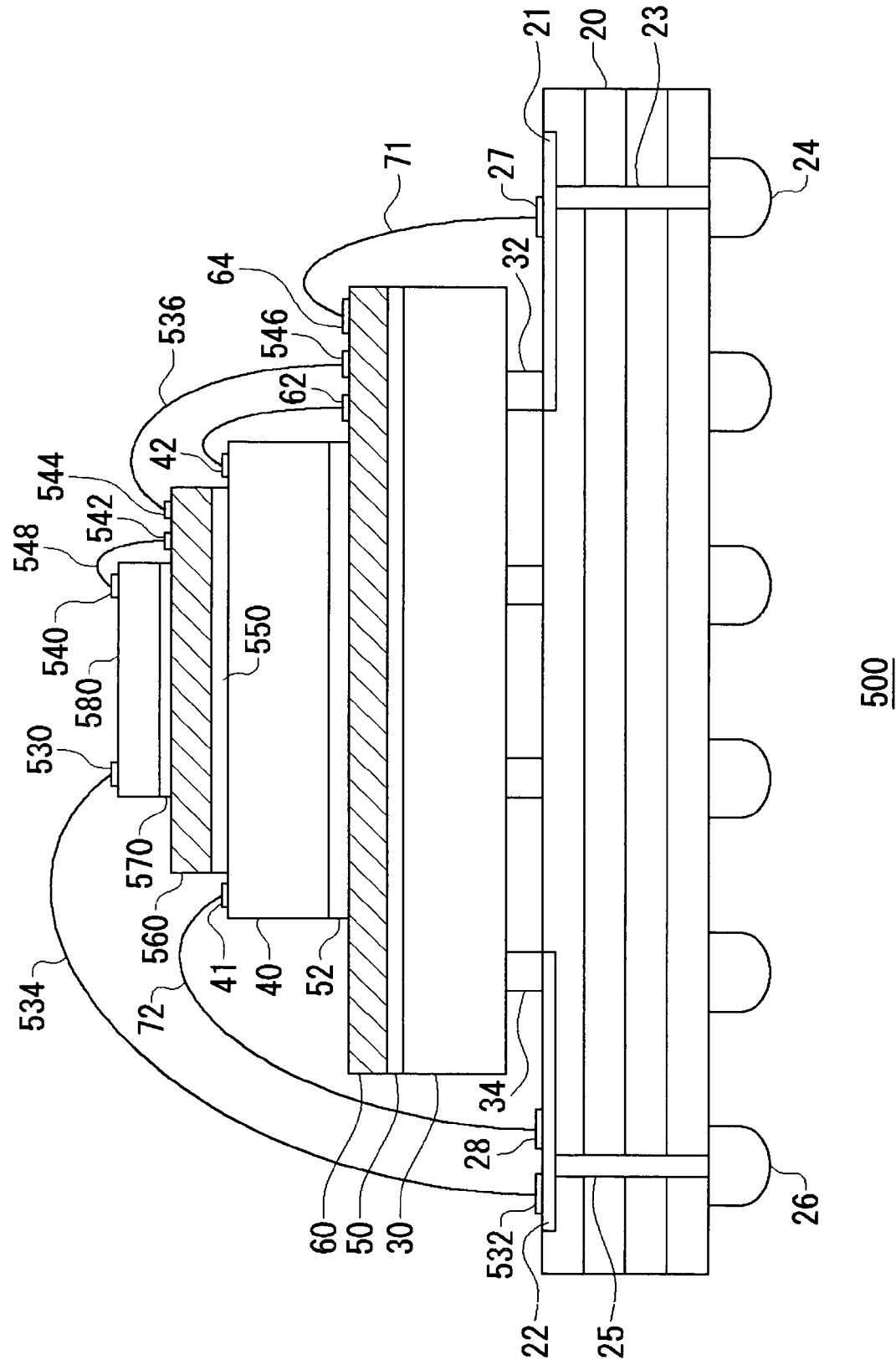
FIG. 6 is a cross-sectional view showing a structure of a circuit device according to a second embodiment of the present invention.
Figure 7:
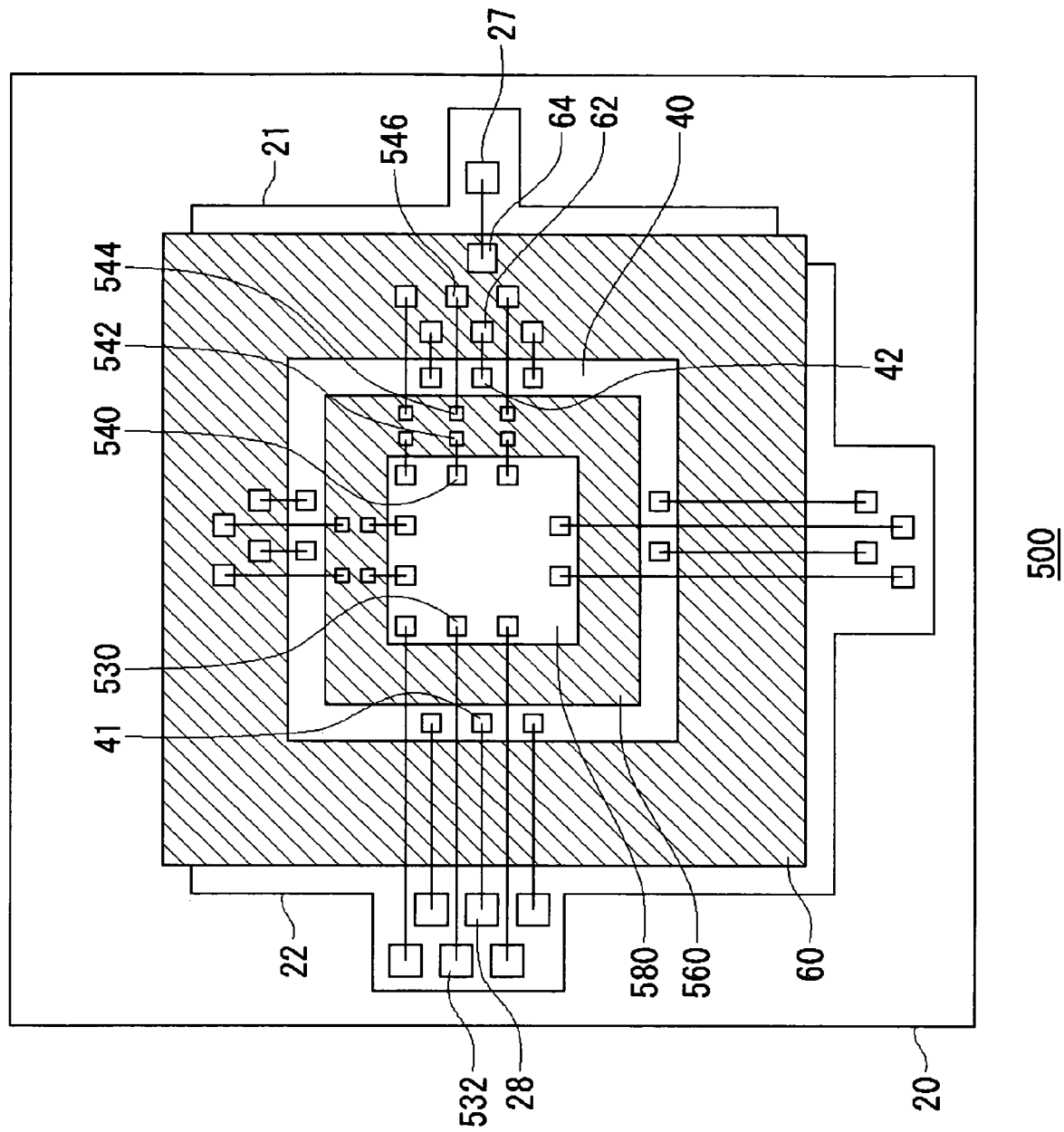
FIG. 7 is a plan view showing a circuit device according to the second embodiment.

FIG. 6 is a cross-sectional view showing a structure of a circuit device 500 according to a second embodiment of the present invention. FIG. 7 is a plan view showing a circuit device according to the second embodiment.

A circuit device 500 according to the second embodiment differs from the circuit device 10 according to the first embodiment in that the circuit elements of the second embodiment are formed by three stacks. A description will be given here of the circuit device 500 according to the second embodiment centering around a structure different from that of the first embodiment.

According to the second embodiment, a third circuit element 580 is further laminated on the second circuit element 40. A pair of insulation layers 550 and 570 are provided between the third circuit element 580 and the second circuit element 40. A conductive layer 560 is interposed between the insulation layer 550 and the insulation layer 570.

A bonding pad 530, for power supply, formed on the surface of the third circuit element 580 is connected to a lead 532 provided on a power supply wiring 22 via a power supply wire 534.

A bonding pad 540 for grounding provided on the surface of the third element 580 is connected to a bonding pad 542 provided on the surface of the conductive layer 560 via a grounding wire 548. A bonding pad 544 provided on the surface of the conductive layer 560 is connected to a bonding pad 546 provided on the surface of a conductive layer 60 via grounding wire 536. A bonding pad 64 provided on the surface of the conductive layer 60 is a lead 27 of a ground wiring 21 via a grounding wire 71. In this manner, the circuit device 500 according to the second embodiment has the third circuit element 580 connected to the ground wiring 21 via the conductive layer 560, in addition to the second circuit element 40 connected to the ground wiring 21 via the conductive layer 60.

According to this structure, a capacitance component for the third circuit element 580 also occurs between the conductive layer 560 and the third circuit element 580. Thus, this structure suppresses the propagation of the ground noise occurring in not only the second circuit element but also the third circuit element to the first circuit element 30 or the second circuit element 40 via the ground wiring 21.

Third Embodiment

Figure 8:
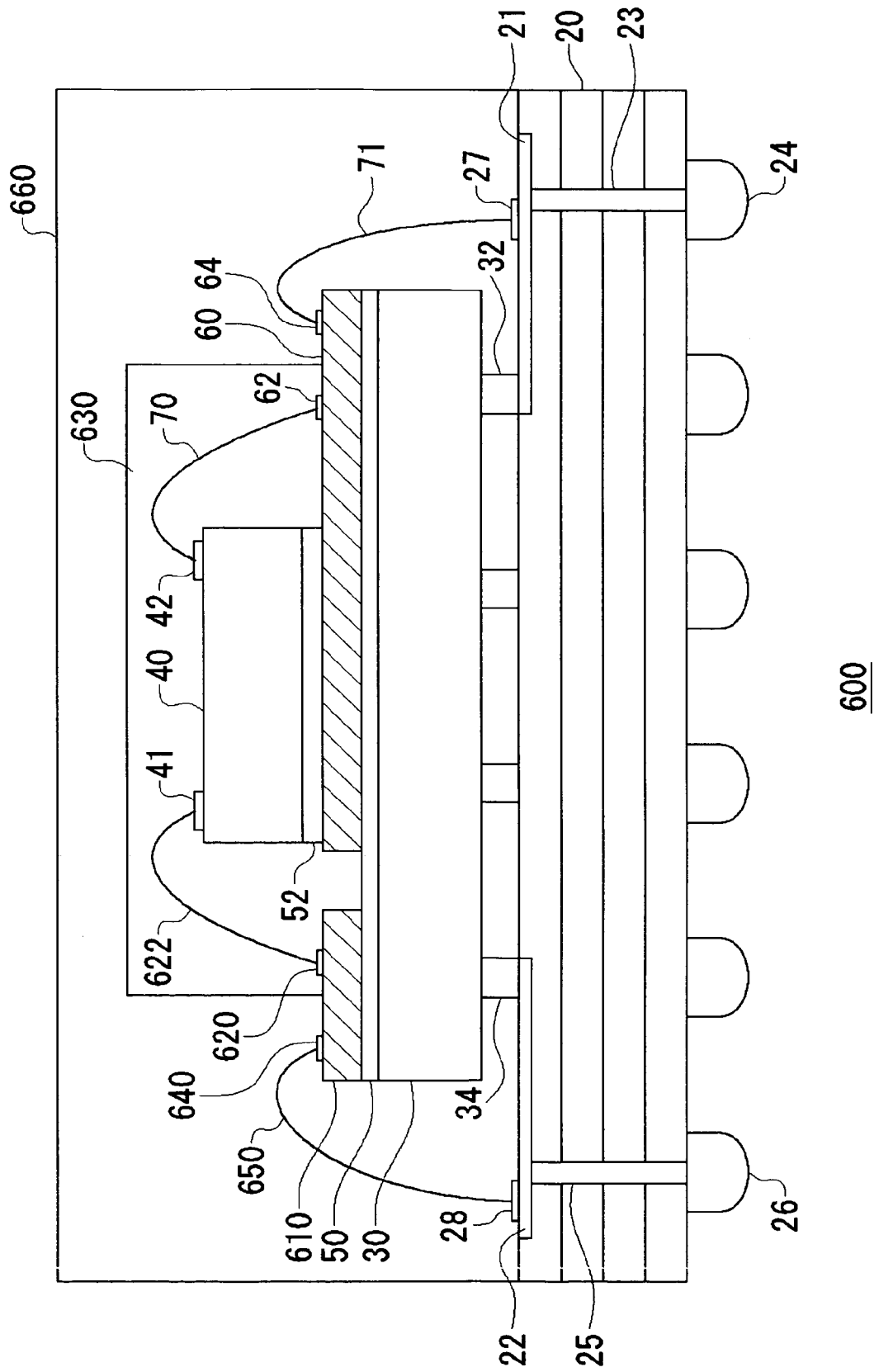
FIG. 8 is a cross-sectional view showing a structure of a circuit device according to a third embodiment of the present invention.

FIG. 8 is a cross-sectional view showing a structure of a circuit device 600 according to a third embodiment of the present invention. A description will be given hereinbelow of the circuit device 600 according to the third of the first embodiment. A packaged second circuit element 40 is used in the circuit device 600. A first circuit element mounted on a substrate 20 and the packaged second circuit element 40 are further packaged.

A structure characteristic of the circuit device according to the third embodiment will now be described. A conductive layer 610 for power supply is formed on an insulation layer 50. A bonding pad 620 for power supply is formed on the surface of the conduction layer 610. The bonding pad 620 for power supply provided on the conductive layer 610 and a bonding pad 41 provided on the second circuit element 40 are electrically connected together via a power supply wire 62 made of gold or the like. The second circuit element 40 together with electric wiring members, such as the bonding wires 620, 62 and 41, the power supply wire 622 and grounding wire 70, are sealed by an encapsulating resin 630.

A bonding pad 640 for power supply is provided on the surface of the conductive layer 610. The bonding pad 640 is electrically connected to a lead 28 provided on a power supply wiring 22 via a power supply wire 650. Thereby, the power supply wiring 22 is electrically connected to the bonding pad 41 provided on the second circuit element by way of the conductive layer 610.

The second circuit element 40 sealed by the encapsulating resin 630 and the first circuit element 30 are sealed by an encapsulating resin 660 together with the electric members, such as the leads 27 and 28, the power supply wire 650 and the grounding wire 71.

In this manner, the same advantageous effects, such as the reduction of ground noise, as found in the first embodiment are obtained in the first circuit element 30 and the second circuit element 40 according to the third embodiment. In this third embodiment, an operation test is performed on the packaged second circuit element 40 and the only circuit elements whose operation has been confirmed and guaranteed can be mounted into the circuit device 600. As a result, the yield of the circuit devices 600 can be enhanced.

Fabrication Method

Figure 9A:
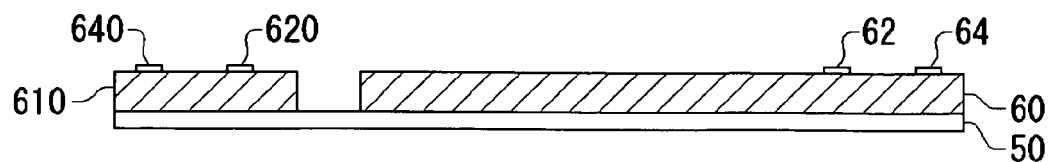
FIGS. 9A to 9C are cross-sectional views showing a process of fabricating a circuit device according to the third embodiment of the present invention.

FIGS. 9A to 9C and FIGS. 10A to 10C are each cross-sectional views showing a process of fabricating a circuit device 600 according to a third embodiment of the present invention. Referring to FIG. 9A, copper foil on an insulation layer 50 is first etched selectively so as to perform etching on a conductive layer 610 for power supply and a conductive layer 60 for grounding. Then, bonding pads 620 and 640 are formed on the conductive layer 610. Bonding pads 62 and 64 are formed on the conductive layer 60.

Figure 9B:
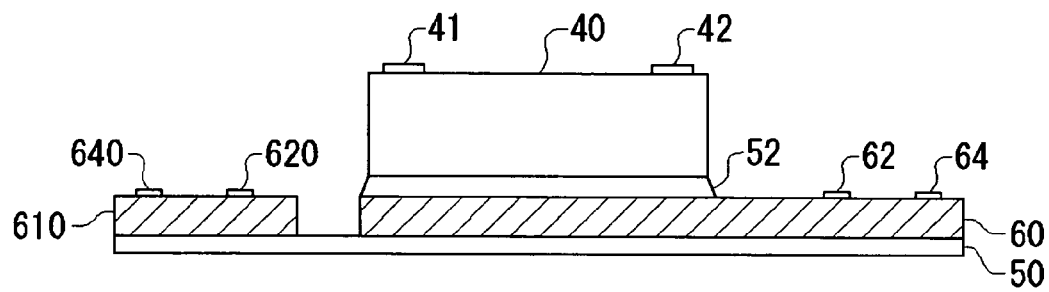

Next, referring to FIG. 9B, an insulation layer 52 is formed on a predetermined area of the conductive layer 60 for grounding, and a second circuit element 40 on which bonding pads 41 and 42 are provided are mounted on the insulation layer 52.

Figure 9C:
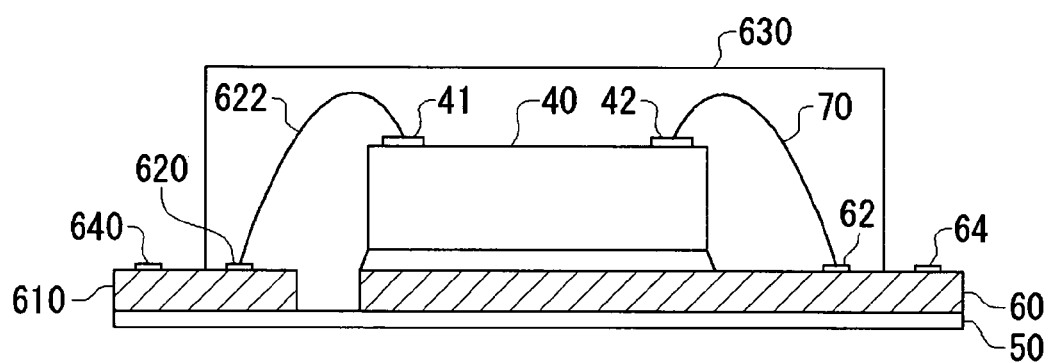

Then, referring to FIG. 9C, the bonding pad 41 on the second circuit element 40 and the bonding pad 620 on the conductive layer 610 are wire-bonded by use of a power supply wire 622. The bonding pad 42 on the second circuit element 40 and the bonding pad 62 on the conductive layer 60 are wire-bonded by use of a grounding wire 70. Using a sealing process such as a transfer mold technique, the second circuit element 40 together with electric wiring members, such as the bonding pads 620, 62, 41 and 42, the power supply wire 622 and the grounding wire 70 are sealed by an encapsulating resin 630. For example, a thermosetting insulating resin such as epoxy resin may be used as the encapsulating resin 630.

In this manner, after the packaging of the second circuit element 40, an operation test is performed. As a result, any defective can be eliminated and the only circuit elements whose operation has been guaranteed can be mounted into the circuit device 600. Packaging the second circuit element 40 makes the handling of the second circuit element 40 easier.

Figure 10A:
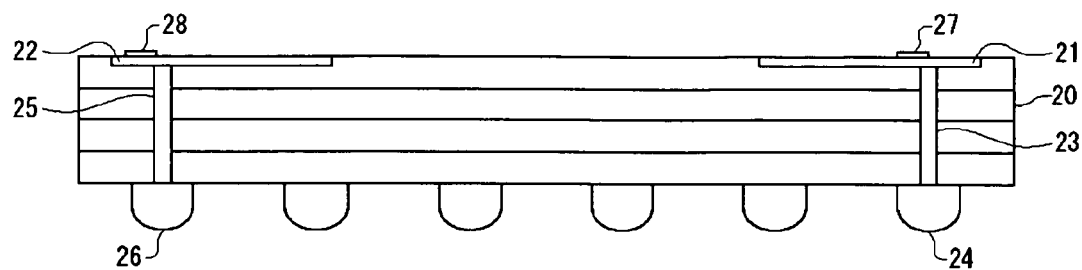
FIGS. 10A to 10C are cross-sectional views showing a process of fabricating a circuit device according to the third embodiment of the present invention.

A substrate 20, as shown in FIG. 10A, having a multilayer wiring structure is prepared. A ground wiring 21 and a power supply wiring 22 are provided on the surface of the substrate 20. The ground wiring 21 is connected to a BGA ball 24 via a copper wiring filled in a via hole 23. The power supply wiring 22 is connected to a BGA ball 26 via a copper wiring filled in a via hole 25.

Figure 10B:
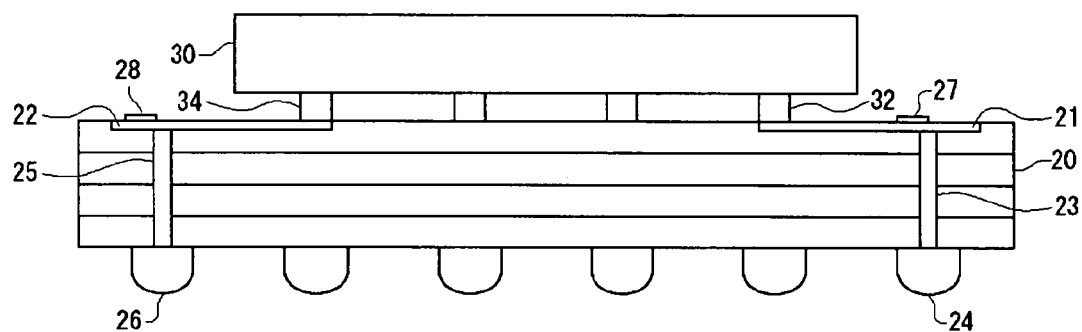

Next, referring to FIG. 10B, a first circuit element 30 is flip-chip bonded onto the substrate 20, and the ground wiring 21 and the power supply wiring 22 are electrically connected to the first circuit element 30 via a bump 32 and a bump 34, respectively.

Figure 10C:
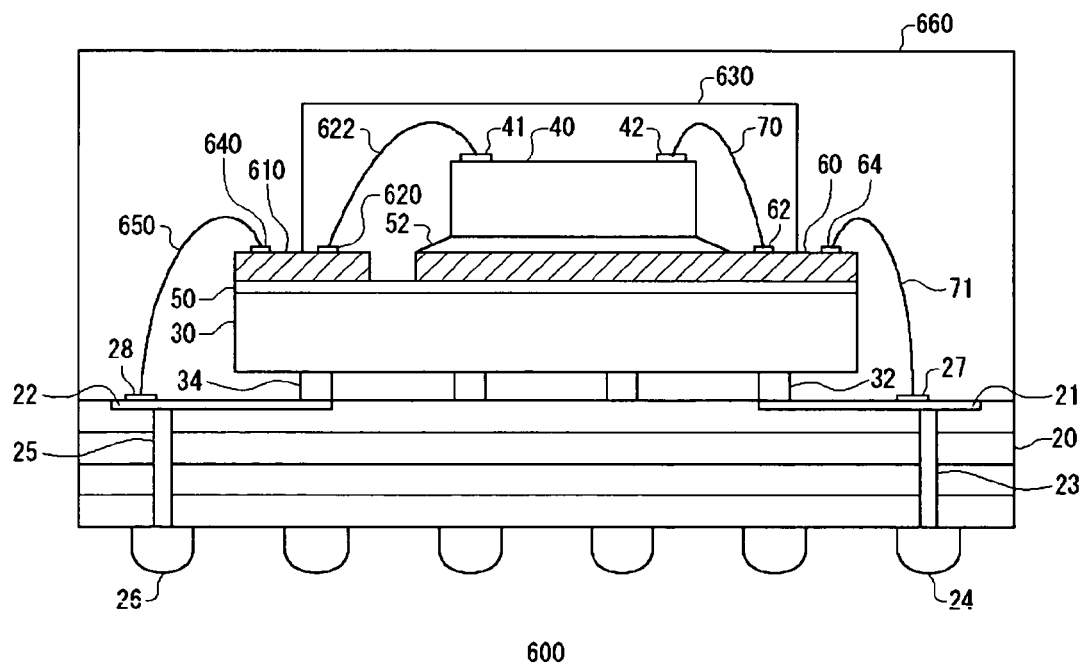

Then, referring to FIG. 10C, the packaged second circuit element 40 is mounted on the first circuit element 30. Thereafter, a bonding pad 640 provided on the conductive layer 610 and a lead 28 provided on the power supply wiring 22 are wire-bonded by a power supply wire 650. A bonding pad 64 provided on the conductive layer 60 and a lead 27 provided on the ground wiring 21 are wire-bonded by a grounding wire 71. The above process makes it possible to manufacture the circuit device 600 according to the third embodiment.

Fourth Embodiment

Figure 11:
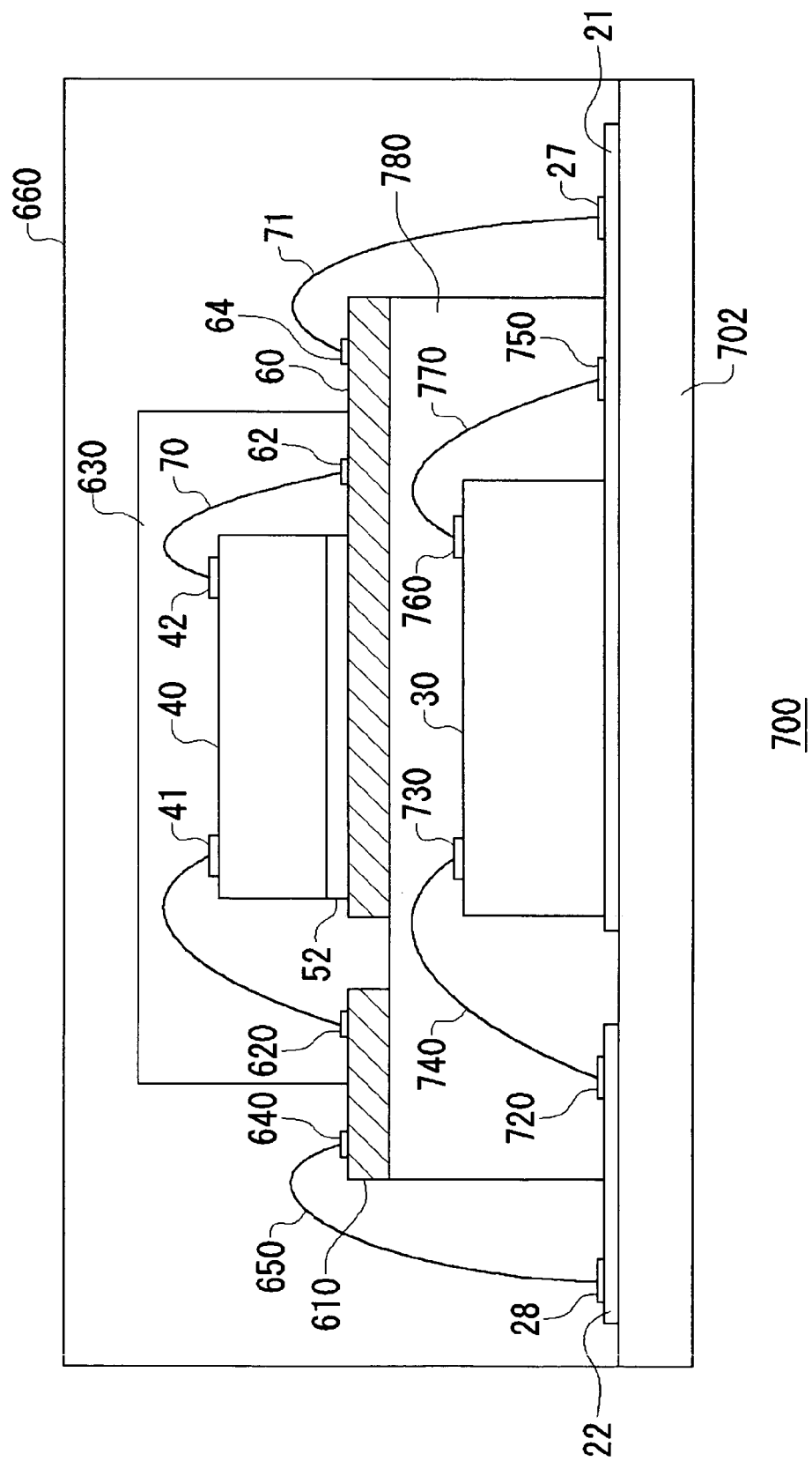
FIG. 11 is a cross-sectional view showing a structure of a circuit device according to a fourth embodiment of the present invention.

FIG. 11 is a cross-sectional view showing a structure of a circuit device 700 according to a fourth embodiment of the present invention. The circuit device 700 differs from the third embodiment in that a first circuit element 30 has been packaged in advance, the insulation layer 50 is removed from the second circuit element and no substrate including a wiring layer is provided. A description will be given hereinbelow of the circuit device 700 according to the fourth embodiment centering around a structure different from that of the third embodiment.

A ground wiring 21 and a power supply wiring 22 according to the fourth embodiment are formed on a base material 702 made of epoxy resin or the like. A lead 750 used for the grounding of a first circuit element 30 and a lead 27 used for the grounding of a second circuit element 40 are provided on a ground wiring 21. A lead 720 used for power connection of the first circuit element 30 and a lead 28 used for power connection of the second circuit element 40 are provided on a power supply wiring 22.

The first circuit element 30 is mounted on the ground wiring 21 via an adhesive (not shown). A bonding pad 730 for power supply provided on the first circuit element 30 and a lead 720 provided on the power supply wiring 22 are electrically connected by a power supply wire 740. A bonding pad 760 for grounding provided on the first circuit element 30 and a lead 750 provided on the ground wire 21 are electrically connected by a grounding wire 770.

The first circuit element 30 together with the electric wiring members, such as the bonding pads 730 and 760, the power supply wire 740 and the grounding wire 770, are sealed by an electrically-insulating encapsulating resin 780.

Similar to the third embodiment, a package where the insulation layer 50 is removed from the packaged second circuit element 40 is mounted on the encapsulation resin 780.

In this manner, in the fourth embodiment the encapsulation resin 780 plays the role of insulation layer 50 of the third embodiment. Hence, the same advantageous effects, such as the reduction of ground noise, as in the third embodiment. In this fourth embodiment, an operation test is performed on the packaged first circuit element 30 and the packaged second circuit element 40 and the only circuit elements whose operation has been confirmed and guaranteed are mounted into the circuit device 700. As a result, the yield of the circuit devices 700 can be enhanced.

Fabrication Method

Figure 12A:
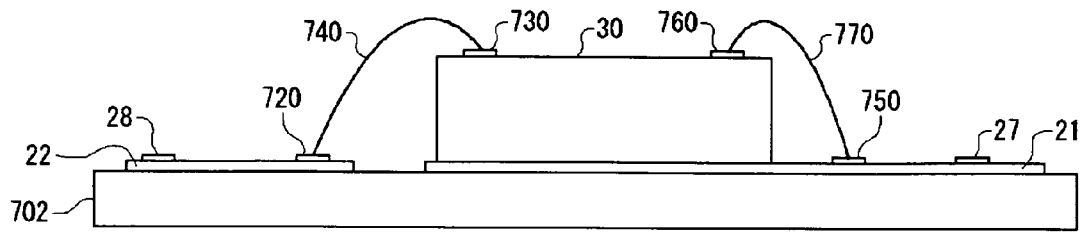
FIGS. 12A to 12C are cross-sectional views showing a process of fabricating a circuit device according to the fourth embodiment of the present invention.
Figure 12B:
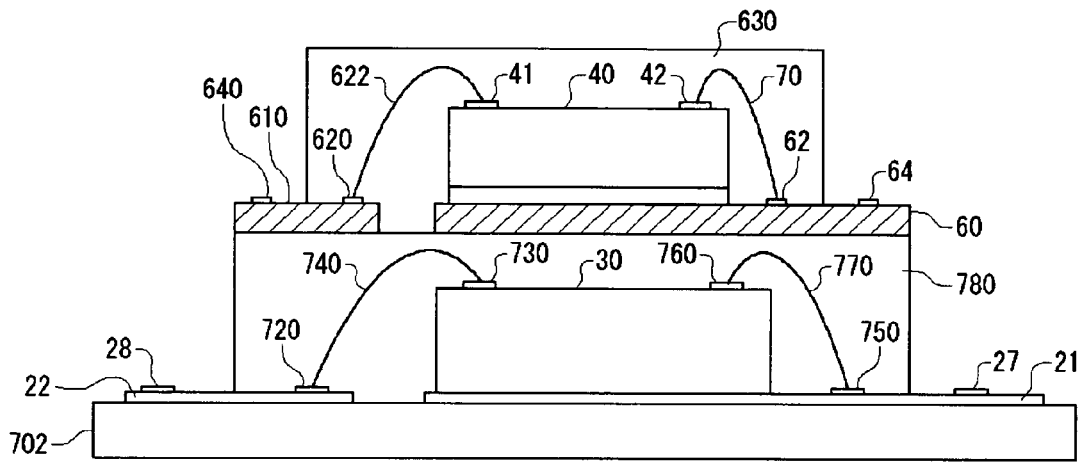
Figure 12C:
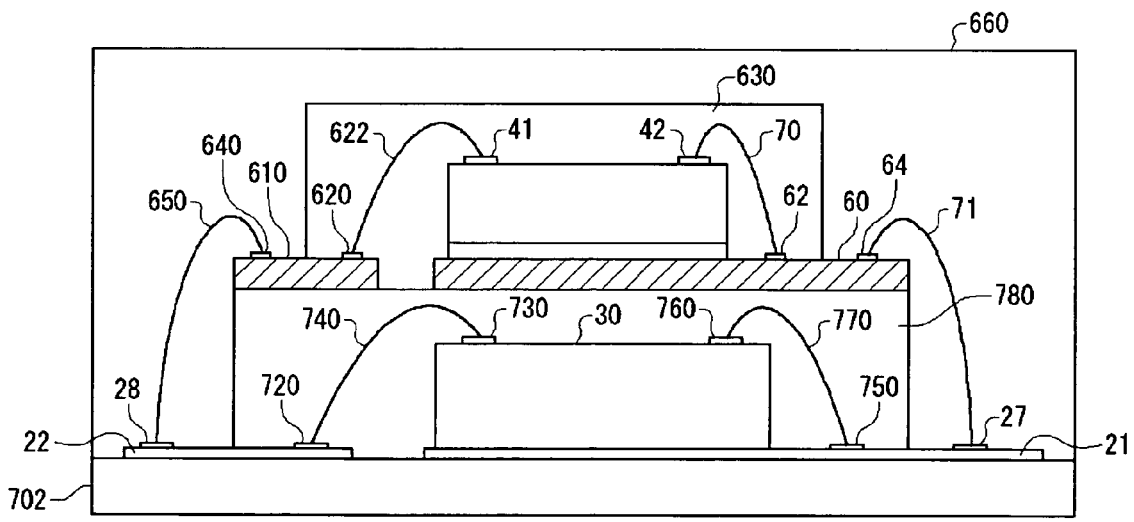
Figure 13:
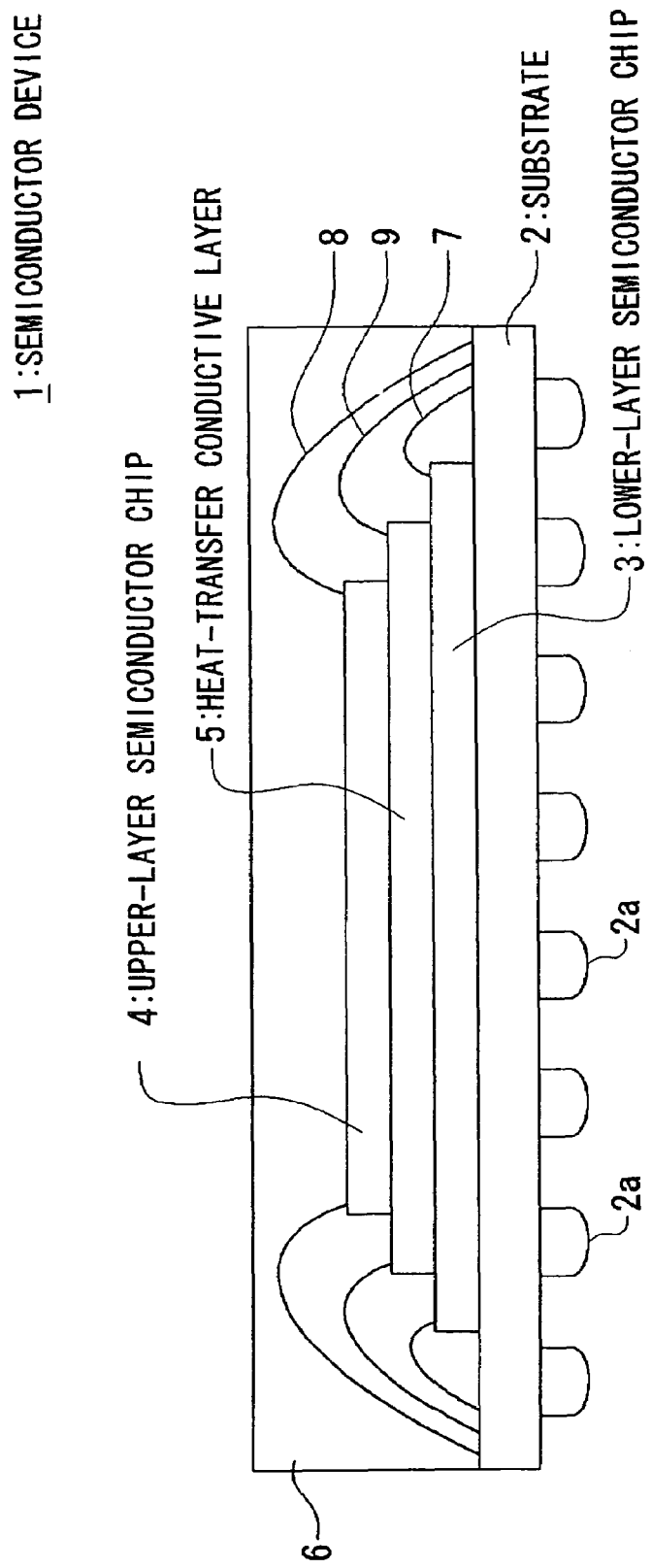
FIG. 13 is a cross-sectional view showing a structure of a conventional circuit device.

FIGS. 12A to 12C are cross-sectional views showing a process of fabricating a circuit device 700 according to a fourth embodiment of the present invention. Referring to FIG. 12A, a ground wiring 21 and a power supply wiring 22 are first formed on a base material made of epoxy resin or the like. A lead 750 used for the grounding of the first circuit element 30 and a lead 27 used for the grounding of the second circuit element are provided on a ground wiring 21. A lead 720 used for power connection of the first circuit element 30 and a lead used for power connection of the second circuit element 40 are provided on a power supply wiring 22. The first circuit element 30 having a bonding pad 730 for power supply and a bonding pad 760 for grounding at predetermined areas of the ground wiring 21 are mounted on the ground wiring 21 at a predetermined position thereof, via an adhesive (not shown). The bonding pad 730 provided on the first circuit element 30 and the lead 720 provided on the power supply wiring 22 are wire-bonded by use of a power supply wire 740. The bonding pad 730 provided on the first circuit element 30 and the lead 720 provided on the power wiring 22 are wire-bonded by use of the power supply wiring 22. The bonding pad 760 provided on the first circuit element 30 and the lead 750 provided on the ground wiring 21 are wire-bonded by a grounding wire 770.

Next, referring to FIG. 12B, the first circuit element 30 together with the electric wiring members, such as the bonding pads 730 and 760, the power supply wire 40 and the grounding wire 770, are sealed by an encapsulation resin 780 using the transfer mold technique. A package where the insulation layer 50 is removed from the packaged second circuit element 40 shown in FIG. 9C is mounted on the encapsulating resin 780 via an adhesive (not shown).

Then, referring to FIG. 12C, a bonding pad 640 for power supply and a lead 28 are wire-bond-connected together by use of a power supply wire 650. A bonding pad 64 for grounding and a lead 27 are wire-bond-connected together by use of the grounding wire 71. Then the whole of the individually packaged first circuit element 30 and the individually packaged second circuit element 40 are sealed by an encapsulating resin 660 using the transfer mold technique. The above process makes it possible to manufacture the circuit device 700 according to the fourth embodiment.

The present invention is not limited to the above-described embodiments only, and it is understood by those skilled in the art that various modifications such as changes in design may be made based on their knowledge and the embodiments added with such modifications are also within the scope of the present invention.

Although in each of the above-described embodiments a multilayer wiring board, for example, is used as a substrate, a single layer wiring board may also be used as the substrate.

In each of the above-described embodiments, the bottom-layer circuit element is flip-chip bonded to the substrate but the bottom-layer circuit element may be wire-bonded to the substrate.

In the second embodiment, the bonding pad 544 is connected to the bonding pad 546 provided on the conductive layer 60 via the grounding wire 536. The bonding pad 544 and the ground wiring 21 may be connected directly via the grounding wire 536 by providing the ground wiring 21 with another lead.

In the second embodiment, the second circuit element 40 and the third circuit element 580 are both connected to the ground wiring by way of conductive layers provided therebelow. However, either one of them which requires the reduction in propagation of ground noise may be ground wired by way of the conduction layer provided therebelow.

In the fourth embodiment, the first circuit element 30 and the second circuit element 40 are each separately packaged, and the whole of the first circuit element 30 and the second circuit element 40 are further packaged. The first circuit element 30 alone may be separately packaged and the whole of the packaged first circuit element and the bare-chip second circuit element 40 may be packaged.

While the preferred embodiments of the present invention have been described using specific terms, such description is for illustrative purposes only, and it is to be understood that changes and variations may be made without departing from the spirit or scope of the appended claims.

What is claimed is:

1. A circuit device comprising:
   a substrate provided with ground wiring
   a plurality of circuit elements laminated on said substrate;
   a pair of insulation layers provided between at least one set of an upper-layer circuit element and a lower-layer circuit element disposed adjacent to each other, among said plurality of circuit elements; and
   a conductive layer interposed between said pair of insulation layers,
   wherein the upper-layer circuit element connects to the ground wiring by way of said conductive layer;
   the upper-layer circuit element, and a first wire connecting the upper-layer circuit element and the conductive layer are sealed by a first encapsulating resin; and
   the upper-layer circuit element sealed by the first encapsulating resin and a second wire connecting the conductive layer and the ground wiring are sealed by a second encapsulating resin.

2. A circuit device according to claim 1, wherein among the plurality of circuit elements a lowest-layer circuit element is flip-chip bonded to said substrate.

3. A circuit device according to claim 1 with two circuit elements laminated therein, wherein the top circuit element connects to the ground wiring by way of said conductive layer provided between the top circuit element and the bottom circuit element.

4. A circuit device according to claim 1 with three or more circuit elements laminated therein, wherein each circuit element disposed second from the bottom and upper than second therefrom connects to the ground wiring by way of a conductive layer provided between the each circuit element and each circuit element disposed therebelow.

5. A circuit device according to claim 1, wherein a portion of said conductive layer overlapped with said insulation layer placed above said conductive layer, which is used for grounding of a circuit element, is equal to a projected portion of the circuit element facing said insulation layer placed above said conductive layer.

6. A circuit device according to claim 1, wherein an area of said conductive layer used for grounding of a circuit element is larger than that of an insulation layer above said conductive layer.

7. A circuit device comprising:
   a ground wiring;
   a plurality of circuit elements laminated on said ground wiring;
   a pair of insulation layers provided between at least one set of an upper-layer circuit element and a lower-layer circuit element disposed adjacent to each other, among said plurality of laminated circuit elements; and
   a conductive layer interposed between said pair of insulation layers,
   wherein the upper-layer circuit element connects to said ground wiring by way of said conductive layer;
   the upper-layer circuit element, and a first wire connecting the upper-layer circuit element and the conductive layer are sealed by a first encapsulating resin; and
   the upper-layer circuit element sealed by the first encapsulating resin and a second wire connecting the conductive layer and the ground wiring are sealed by a second encapsulating resin.

8. A circuit device according to claim 7 with two circuit elements laminated therein, wherein the top circuit element connects to said ground wiring by way of said conductive layer provided between the top circuit element and the bottom circuit element.

9. A circuit device according to claim 7 with three or more circuit elements laminated therein, wherein each circuit element disposed second from the bottom and upper than second therefrom connects to said ground wiring by way of said conductive layer provided between the each circuit element and each circuit element disposed therebelow.

10. A circuit device according to claim 7, wherein a portion of said conductive layer overlapped with said insulation layer placed above said conductive layer, which is used for grounding of a circuit element, is equal to a projected portion of the circuit element facing said insulation layer placed above said conductive layer.

11. A circuit device according to claim 7, wherein an area of said conductive layer used for grounding of a circuit element is larger than that of an insulation layer above said conductive layer.

* * * * *